United States Patent
Sinha et al.

(10) Patent No.: US 11,137,418 B2
(45) Date of Patent: Oct. 5, 2021

(54) DEVICE TEST PAD PROBE CARD STRUCTURE WITH INDIVIDUAL PROBE MANIPULATION CAPABILITY

(71) Applicant: International Business Machines Corporation, Armonk, NY (US)

(72) Inventors: Kushagra Sinha, Wappingers Falls, NY (US); Pablo Nieves, Schenectady, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 16/291,755

(22) Filed: Mar. 4, 2019

(65) Prior Publication Data

US 2020/0284823 A1    Sep. 10, 2020

(51) Int. Cl.
| | | |
|---|---|---|
| *G01R 31/00* | (2006.01) | |
| *G01R 1/073* | (2006.01) | |
| *G01R 31/28* | (2006.01) | |
| *G01R 1/04* | (2006.01) | |
| *G01R 3/00* | (2006.01) | |

(52) U.S. Cl.
CPC ....... *G01R 1/07392* (2013.01); *G01R 1/0408* (2013.01); *G01R 31/2886* (2013.01); *G01R 31/2887* (2013.01); *G01R 31/2889* (2013.01); *G01R 31/2891* (2013.01); *G01R 31/2893* (2013.01); *G01R 3/00* (2013.01); *G01R 31/2808* (2013.01)

(58) Field of Classification Search
CPC ............ G01R 31/2891; G01R 31/2887; G01R 31/2893; G01R 31/2886; G01R 1/0408; G01R 31/2889; G01R 31/2808; G01R 3/00; G01R 1/07392; G01R 1/07307
USPC ......... 324/71, 378, 403, 415, 425, 500, 537, 324/750.16
See application file for complete search history.

(56) References Cited

U.S. PATENT DOCUMENTS

| | | |
|---|---|---|
| 4,195,259 A | 3/1980 | Reid et al. |
| 6,072,190 A | 6/2000 | Watanabe et al. |
| 6,174,744 B1 | 1/2001 | Watanabe et al. |
| 8,421,491 B2 | 4/2013 | Chen et al. |

(Continued)

FOREIGN PATENT DOCUMENTS

WO     2008008065 A1    1/2008

OTHER PUBLICATIONS

F. Wang et al., "MEMS Vertical Probe Cards with Ultra Densely Arrayed Metal Probes for Wafer-Level IC Testing," Journal of Microelectromechanical Systems, Aug. 2009, pp. 933-941, vol. 18, No. 4.

(Continued)

*Primary Examiner* — Raul J Rios Russo
(74) *Attorney, Agent, or Firm* — Randall Bluestone; Ryan, Mason & Lewis, LLP

(57) ABSTRACT

A test probe assembly for use in testing a semiconductor wafer includes a probe card, a plurality of test probes mounted to the probe card and one or more piezoelectric elements mounted to each test probe. The piezoelectric elements are configured to move respective probe ends of the individual test probes in at least one direction to facilitate realignment of the probe ends for semiconductor wafer testing.

20 Claims, 12 Drawing Sheets

(56) References Cited

U.S. PATENT DOCUMENTS

| | | | |
|---|---|---|---|
| 2002/0024354 A1* | 2/2002 | Pietzschmann | G01R 1/07378 324/750.22 |
| 2003/0080764 A1* | 5/2003 | Zhou | G01R 1/07314 324/750.25 |
| 2004/0036490 A1* | 2/2004 | Schaeffer | G01R 1/07392 324/750.25 |
| 2005/0206399 A1* | 9/2005 | Schaeffer | G01R 31/2886 324/750.03 |
| 2008/0265927 A1* | 10/2008 | Mayder | G01R 1/06733 324/754.14 |
| 2012/0115757 A1 | 5/2012 | Adams | |
| 2013/0069683 A1* | 3/2013 | Kuo | H05K 3/00 324/755.03 |
| 2014/0005551 A1 | 1/2014 | Ozawa et al. | |
| 2015/0369899 A1 | 12/2015 | Ben Jamaa | |
| 2016/0216321 A1 | 7/2016 | Edwards et al. | |

OTHER PUBLICATIONS celadonsystems.com, "VC20 Probe Card: 20MM Probe Card for Modeling & Characterization, Parametric Test, and Wafer Level Reliability," https://www.celadonsystems.com/products/#vc20e_probe_card, Oct. 15, 2012, 3 pages.

\* cited by examiner

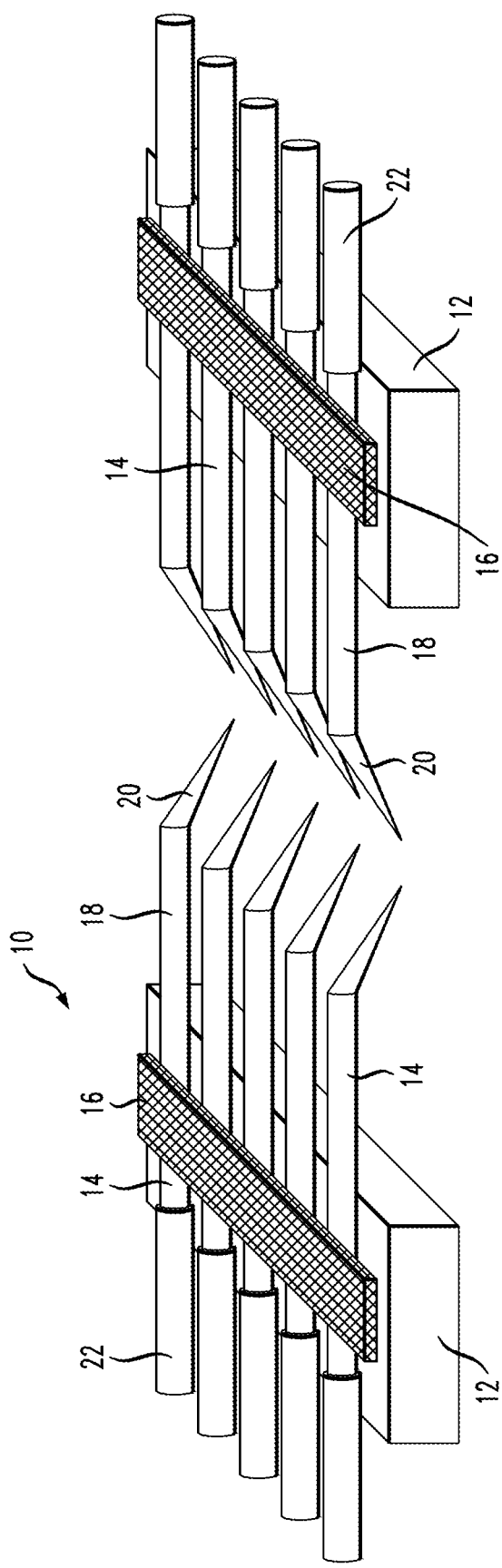

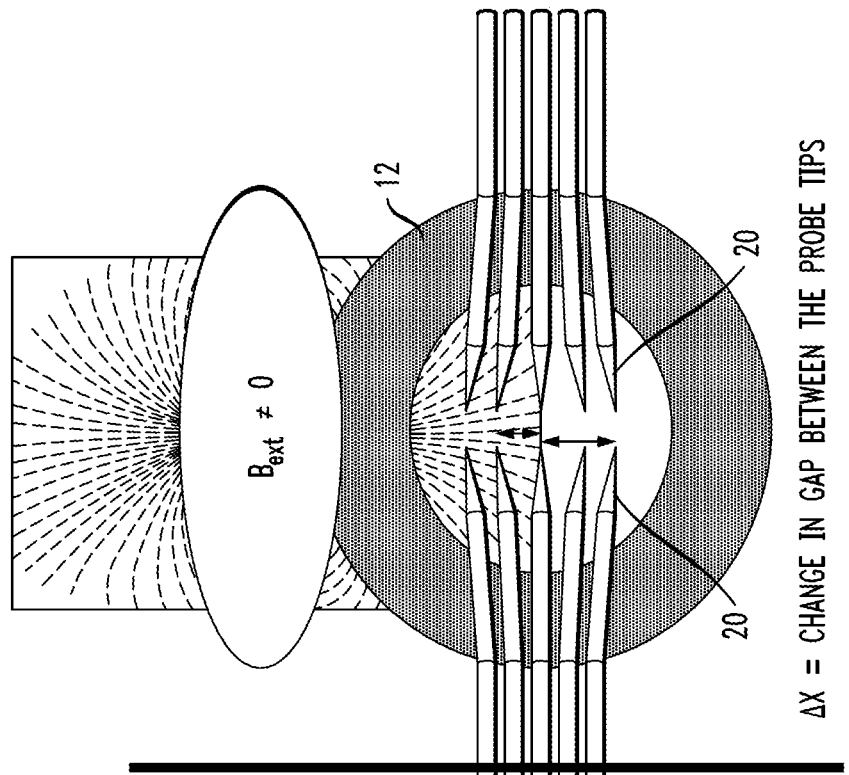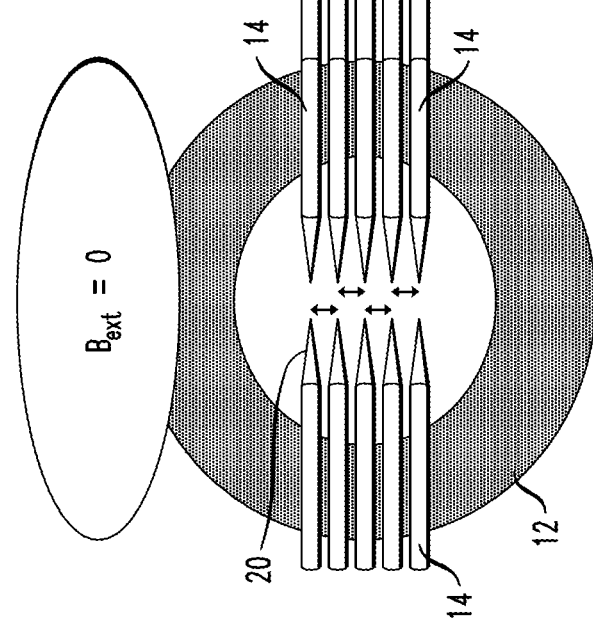

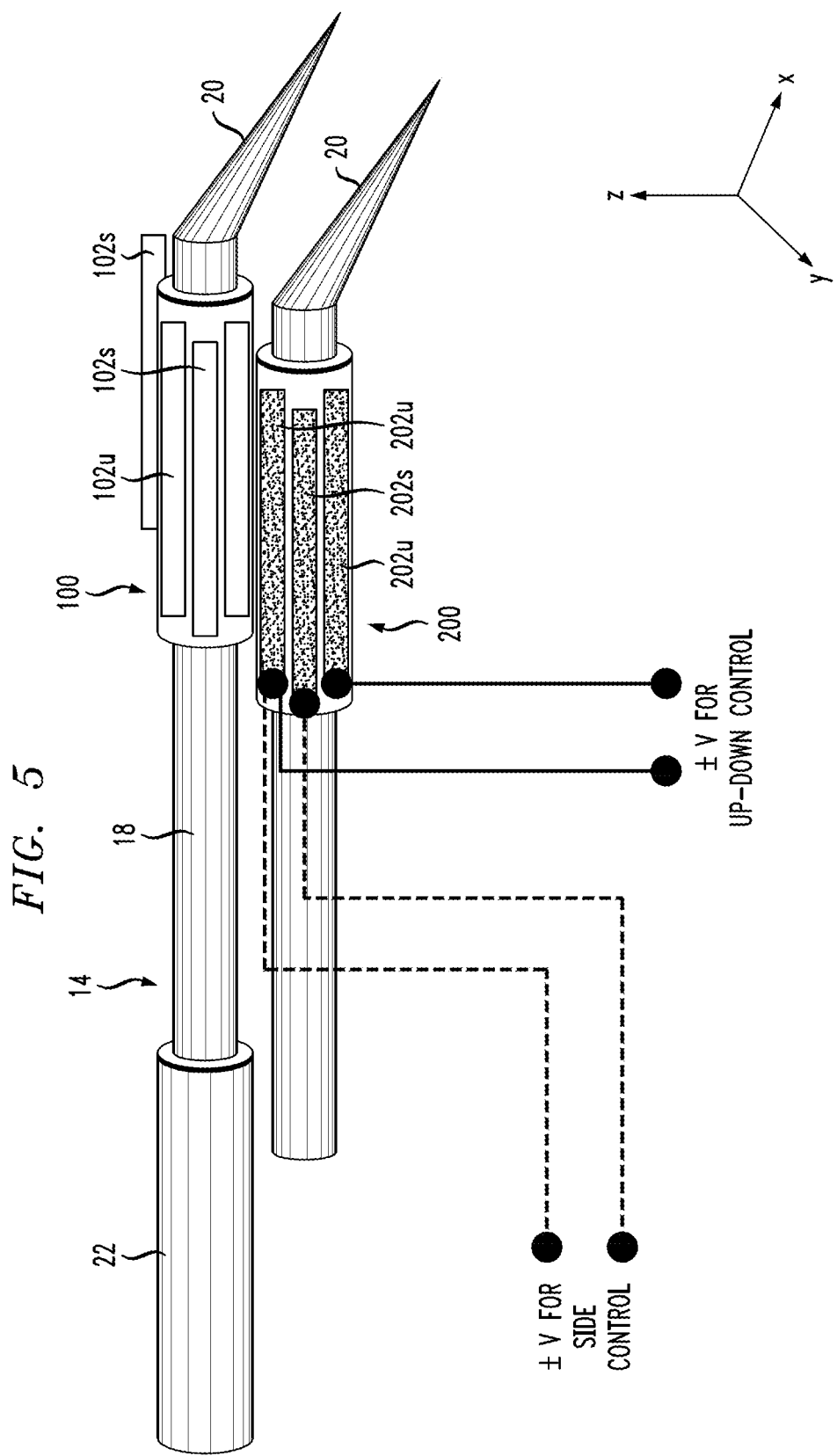

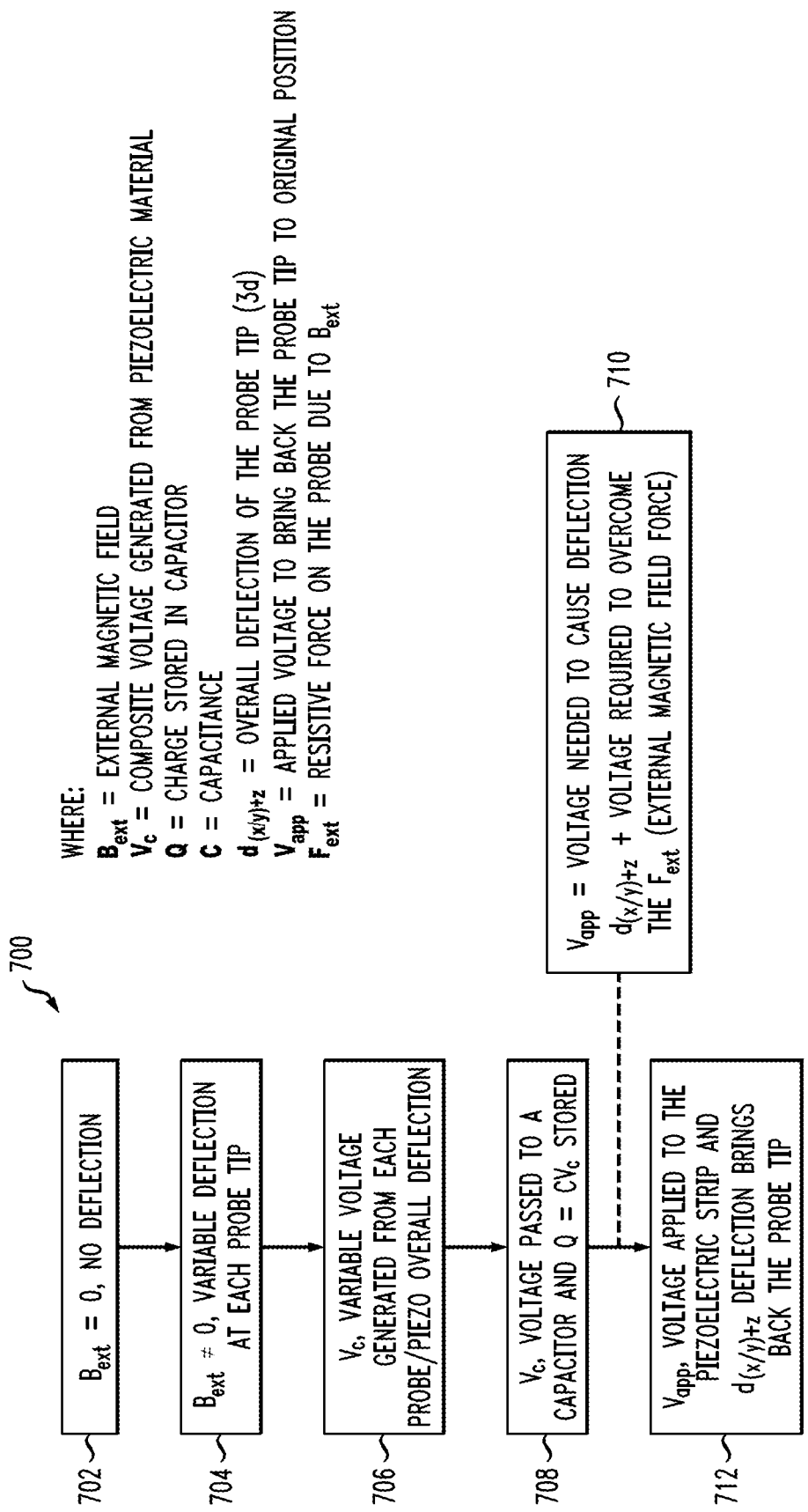

Q = CV_c STORED

WHERE:
$V_c$ = COMPOSITE VOLTAGE GENERATED FROM PIEZOELECTRIC MATERIAL
Q = CHARGE STORED IN CAPACITOR
C = CAPACITANCE
$V_{app}$ = APPLIED VOLTAGE TO BRING BACK THE PROBE TIP TO ORIGINAL POSITION

1010

DEVICE TEST PAD PROBE CARD STRUCTURE WITH INDIVIDUAL PROBE MANIPULATION CAPABILITY

BACKGROUND

The present application generally relates to a test probe assembly for testing a semiconductor wafer, and more particularly, relates to a test probe assembly, a system and associated methodology to detect displacement of probe ends of test probes from an original position, and to realign the probe ends of the test probes for subsequent use in semiconductor wafer testing.

SUMMARY

Embodiments of the present application provide techniques for detecting and realigning displaced test probes of a test probe assembly used in semiconductor wafer testing. In illustrative embodiments, the test probes may be adjusted on an individual basis in response to application of an electric field to piezoelectric elements mounted to each of the test probes.

In one exemplary embodiment, a test probe assembly for use with testing of a semiconductor wafer, includes a probe card, a plurality of test probes mounted to the probe card, and each having a probe end and one or more piezoelectric elements mounted to each test probe. The one or more piezoelectric elements are configured to individually move respective probe ends of the test probes in at least one direction to facilitate alignment of the probe ends in connection with a testing process on a semiconductor wafer. In illustrative embodiments, the one or more piezoelectric elements are configured to effect individual multidirectional movement of the probe ends of each test probe along x, y and z axes of direction.

In another exemplary embodiment, a method is disclosed. The method includes mounting one or more piezoelectric elements to a test probe of a test probe assembly and detecting, with the one or more piezoelectric elements, movement of at least the probe end of the test probe from an original position. The method may further realign, upon actuation of the one or more piezoelectric elements, the probe end of the test probe toward the original position.

In another exemplary embodiment, a system is disclosed. The system comprises a test probe assembly including a probe card and a plurality of test probes mounted to the probe card. Each test probe includes a probe end, and one or more piezoelectric elements mounted to each test probe. The one or more piezoelectric elements are configured to generate an output voltage upon individual displacement of the probe end of each test probe from an original position and return the probe end of each test probe toward the original position upon actuation of the one or more piezoelectric elements. The system further includes a processor having logic configured to control actuation of the one or more piezoelectric elements of each test probe to cause return of the probe end of each test probe to the original position.

BRIEF DESCRIPTION OF THE DRAWINGS

FIG. 1 is a schematic view of a conventional test probe assembly in which the features of the present invention may be incorporated.

FIG. 2 is a top plan view of the test probe assembly of FIG. 1 illustrating the probe card and the test probes with the test probes in their respective original positions in the absence of a magnetic field.

FIG. 3 is a view similar to the view of FIG. 2 illustrating deflection of the probe ends of the test probes when subjected to a magnetic field.

FIG. 5 is an enlarged isolated view illustrating individual test probes and mounted piezoelectric assemblies according to one or more embodiments of the present invention.

FIG. 11 is a flow chart illustrating one exemplary methodology of use of the test probe assembly for deflection of probe ends of individual test probes according to one or more embodiments of the present application.

DETAILED DESCRIPTION

Figure 4:
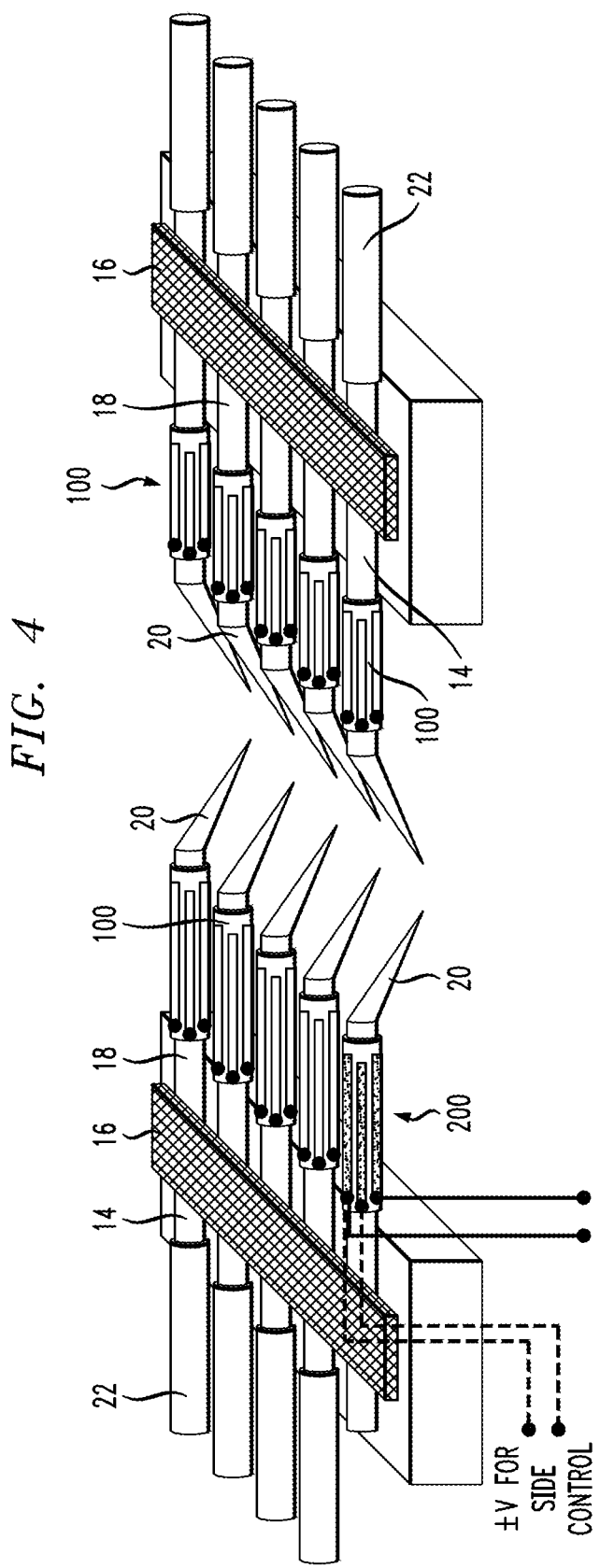
FIG. 4 is a schematic view similar to the view of FIG. 1 illustrating the test probe assembly having piezoelectric assemblies mounted on each test probe to deflect the individual probe ends according to one or more embodiments of the present invention.

Illustrative embodiments of the present invention will be described hereinbelow of a test probe assembly, system and methodology for realigning individual test probes of the test probe assembly, which may be subject to misalignment during repeated use or upon exposure to an external magnetic field. Illustrative embodiments are further capable of detecting deflecting movement in each of the x, y and z axes of at least the probe ends of individual test probes from an original position while also effecting return movement of these probe ends along the x, y and z axes toward their respective original individual positions prior to use in a wafer testing procedure. Illustrative embodiments include incorporating piezoelectric elements within the test probes to detect strain or distortion forces on the probe ends, and then subjecting the piezoelectric elements to an electric field to cause realignment of the probe ends to their respective operative positions.

Prior to explaining details of the illustrative embodiments of the test probe alignment and integrity system of the present application, a brief explanation of conventional test probe assemblies and their deficiencies serving as motivation for the illustrative embodiments will now be provided. A conventional test probe assembly is mountable to an electrical testing system which is used in conducting functional, electrical and/or parametric testing of semiconductor wafers. Testing systems with various testing capabilities are commercially available from multiple manufacturers. One conventional test system is the Tokyo Electron, Ltd. (TEL) prober. This prober generally includes a frame, a movable stage and a wafer chuck which holds the semiconductor wafer to be tested. A drive mechanism drives the stage and the wafer chuck in at least the x-direction and the y-direction. The frame includes a circular opening and has a probe card or ring mounted about the circular opening. The probe card includes a series of individual needle probes arranged to contact the test pads of the semiconductor wafer during a testing procedure. The prober further includes a camera to image the probes of the probe card and the test pads of the semiconductor wafer to assist in the aligning process. The testing procedure generally includes aligning the test probes with the test pads of the semiconductor wafer and moving the probe card or stage to cause electrical contact of the test pads with respective individual test probes. Testing and validation of the circuitry on the wafer are performed through the test probes. A Central Processing Unit (CPU) controls the entire operation of the probe system.

In many instances in using a testing system, the probe ends of the needle probes of the probe card become misoriented or distorted due to, for example, repeated testing, or when subjected to an external magnetic field applied during activation of the electrical components of the semiconductor wafer in connection with a testing procedure. This affects alignment of the test probes with the test pads of the semiconductor wafer. Proper alignment of the test probes with the center of each of the test pads is critical to obtain accurate test results of the functioning of the circuitry on the semiconductor wafer.

Testing of the semiconductor wafers is performed at many stages of the semiconductor manufacturing process to enable detection, diagnosis, and correction of defective processes. Preferably, the determination of any issue with the wafer occurs at an early stage to offset wafer failure and associated cost, as well as to take corrective measures on any defective test probes of the probe card. However, due to the potential distortion of the probe ends of the test probes for the reasons discussed hereinabove, irregular wafer testing may be problematic and result in improper diagnosis of issues, increased maintenance cost and downtime. Thus, illustrative embodiments of the present application provide an apparatus, a system and a methodology to detect and remedy misaligned test probes at early stages in the manufacturing processes and prior to initiating a subsequent testing procedure.

FIG. 1 illustrates an exemplary embodiment of a test probe assembly which may incorporate the principles and features of the present invention. The test probe assembly may be utilized with any conventional wafer testing system including the TEL prober discussed hereinabove. The test probe assembly 10 includes a probe card 12 and a plurality of test probes 14 mounted to, or coupled with, the probe card 12. Although depicted in FIG. 1 as two separate rectangular substrates, the probe card 12 is typically in the shape of a continuous ring. The probe card 12 is held within the testing system by a card holding mechanism (not shown). The test probes 14 are distributed about the probe card 12, e.g. preferably, to be in alignment with respective test pads of a semiconductor wafer to be tested. More specifically, each test probe 14 has a dedicated test pad. The test probes 14 are secured relative to the probe card 12 via conventional means including an epoxy layer 16 or any other suitable cement or adhesive.

The probe card 12 and the test probes 14 are customized to the semiconductor wafer undergoing testing. In one exemplary embodiment depicted in the FIGS. 1-2, the probe card 12 has ten (10) test probes 14 spaced about the probe card 12. Other arrangements are also envisioned including, but not limited to, twenty-five (25) or fifty (50) test probes 14. Each test probe 14 includes a linear segment 18 and a probe end 20 which contacts the test pads of the semiconductor wafer. The probe ends 20 may be obliquely arranged relative to the linear segment 18. A sheathing 22 is positioned over an end of the linear segment 18 of the test probe 14 remote from the probe end 20. The sheathing 22 is made of a non-magnetic material.

Referring now to FIGS. 2-3, when subjected to distortion forces such as, for example, a magnetic field $B_{EXT}$ applied to activate electric components of the semiconductor wafer during a testing procedure, at least the probe ends 20 of the test probes 14 may be displaced from their original operative positions of FIG. 2 to respective displaced or deflected positions depicted in FIG. 3. The displacement, represented by $\Delta X$, is due at least in part to the magnetic attraction between the metallic test probes 14 and the magnetic field $B_{EXT}$ generated during wafer testing. In the misoriented or deflected positions of FIG. 3, the probe ends 20 would be misaligned with respective test pads on the semiconductor wafer. Thus, testing of the components of the wafer is infeasible and would return none or inaccurate results.

Referring now to FIGS. 4 and 5, the test probe assembly 10 is depicted incorporating some of the features of the present invention. Mounted to each test probe 14 is a piezoelectric assembly 100, 200. The piezoelectric assembly 200 is a different embodiment from the piezoelectric assembly 100 and will be discussed in greater detail hereinbelow. The piezoelectric assemblies 100, 200 may be mounted on the linear segments 18 of the test probes 14 generally adjacent the angled probe ends 20. In the alternative, the piezoelectric assemblies 100, 200 may be mounted directly on the angled probe ends 20 or mounted at locations more remote from the probe ends 20. In general, the piezoelectric assemblies 100, 200 include an array of piezoelectric elements 102, 202 configured to detect three-dimensional movement of the probe ends 20 from their original respective positions through generation of a composite output voltage signal in response to pressure, strain or displacement experienced by the piezoelectric assemblies 100, 200. In addition, the piezoelectric elements 102, 202 of the piezoelectric assemblies 100, 200 are also configured as actuators to move and realign the probe ends 20 with respect to the test pads upon application of an electric field, e.g., a voltage to the piezoelectric assemblies 100, 200. Multidimensional detection of deflection of each probe end 20 of each test probe 14 may be effected on an individual basis. Similarly, realignment of each probe end 20 of each test probe 14 may be effected on an individual basis and through three-dimensional movement caused by activation of the piezoelectric assembly 100, 200 associated with each respective individual test probe 14.

FIG. 5 is an isolated view of two test probes 14 one of which has the piezoelectric assembly 100 and the other having the piezoelectric assembly 200. In one exemplary embodiment, each piezoelectric assembly 100, 200 coupled to each test probe 14 includes an array of piezoelectric elements 102, 202, respectively. The array may include one or more piezoelectric elements 102, 202, e.g., at least two elements. In one illustrative embodiment, the array includes four piezoelectric elements 102, 202 which are equidistantly spaced about the perimeter or circumference of the test probe 14. The four piezoelectric elements 102, 202 detect and/or control multidimensional movement of at least the probe end 20 of the individual test probes 14 along the x, y and z axes as represented in FIG. 5. In one embodiment, the piezoelectric elements 102, 202 are disposed on opposed sides of the test probe 14, for example, piezoelectric elements 102$s$, 202$s$, can detect or control lateral or side to side movement in the x and y direction. The piezoelectric elements 102$u$, 202$u$ on the opposed lower and upper surfaces can detect or control movement along the z-axis. In the embodiment depicted in FIG. 5, a voltage source "V" is shown coupled to each of the side piezoelectric elements 102, 202 and a voltage source "V" is coupled to each of the upper and lower piezoelectric elements 102, 202. Negative and positive voltages may be applied to the respective piezoelectric elements 102, 202 to control multidirectional movement of the probe ends 20 along a path having an x component, a y-component and a z-component of direction.

Figure 7A:
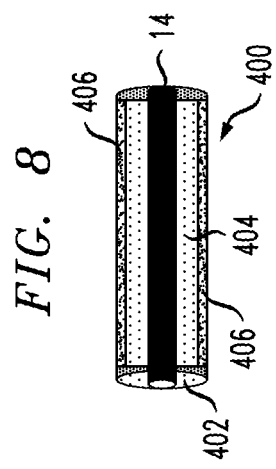
FIG. 7A is a view of an exemplary process of manufacture of a piezoelectric assembly according to one or more embodiments of the present invention illustrating the base substrate of the piezoelectric assembly.
Figure 7B:
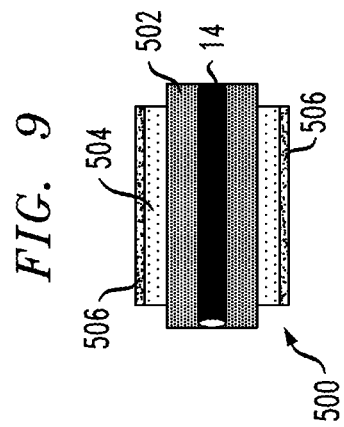
FIG. 7B is a view of the process of manufacture of the piezoelectric assembly according to one or more embodiments of the present invention illustrating the cavities etched in the substrate.
Figure 7C:
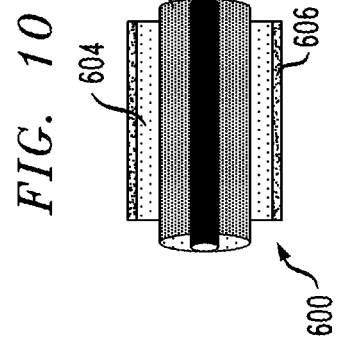
FIG. 7C is a view of the process of manufacture of the piezoelectric assembly according to one or more embodiments of the present invention illustrating the piezoelectric elements deposited in the cavities.
Figure 6:
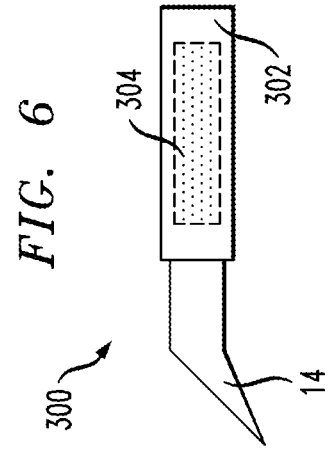
FIG. 6 is a side elevation view illustrating the piezoelectric assembly mounted to the test probe according to one or more embodiments of the present invention.

Referring now to FIG. 6, another exemplary embodiment of the piezoelectric assembly for use with the test probe assembly 10 is illustrated. In accordance with this embodiment, the piezoelectrical assembly 300 is cuboidal in shape having four sides 302 with a piezoelectric film 304 embedded within each side 302. FIGS. 7A-7D illustrate one methodology for forming the piezoelectric assembly 300. A cuboidal base substrate 306 is provided (FIG. 7A). The base substrate 306 may be any suitable insulative strip base material including, but not limited to, nitride or oxide deposited materials. The base substrate 306 is subjected to a controlled etching process to define a cavity 308 within each side (FIG. 7B). Thereafter, a piezoelectric element 310, for example, a piezo film or piezoelectric strip 310, is deposited on the etched surfaces within each cavity 308 of each side of the base substrate 306. (FIG. 7C). A metal coating or plate 312 is then applied to enclose the piezoelectric element 304 (FIG. 7D) and form the piezoelectric assembly 300. The metal coating may be copper or titanium or any other suitable material. The base substrate 306 has a central bore for reception of the test probe 14. In one exemplary embodiment, the base substrate 306 is positioned on the test probe 14 and the manufacturing steps are performed to form the piezoelectric assembly 300.

Figure 8:
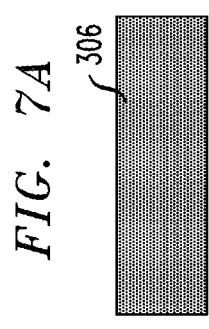
FIG. 8 is a view of another illustrative embodiment of a piezoelectric assembly mounted to the test probe according to one or more embodiments of the present invention.

FIG. 8 illustrates another embodiment of a piezoelectric assembly suitable for use with the test probe assembly 10. The piezoelectric assembly 400 is substantially identical to the piezoelectric assembly 300 of FIGS. 7A-7D, but includes a cylindrical base substrate 402 instead of a cuboidal base substrate. The piezoelectric elements 404 and metal coating 406 are applied at approximately 90° intervals, for example, equidistantly, about the exterior surface of the cylindrical base substrate 402. The same manufacturing steps are utilized as described in connection with the embodiment of FIGS. 7A-7D, including, for example, providing the base substrate 402, etching four surface portions of the base substrate 402 to define cavities, depositing the piezoelectric elements 404 onto the base substrate 402 and coating the piezoelectric elements 404 with a metal coating 406.

Figure 9:
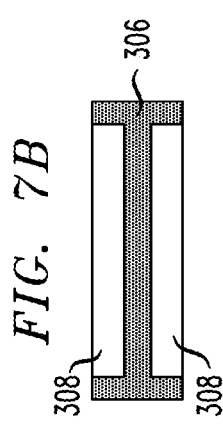
FIG. 9 is a view of another illustrative embodiment of a piezoelectric assembly mounted to the test probe according to one or more embodiments of the present invention.
Figure 10:
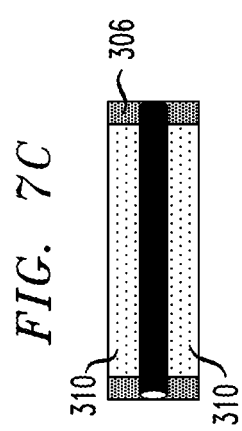
FIG. 10 is a view of yet another illustrative embodiment of a piezoelectric assembly mounted to the test probe according to one or more embodiments of the present invention.
Figure 7D:
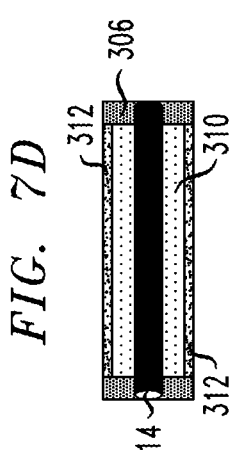
FIG. 7D is a view of the process of manufacture of the piezoelectric assembly according to one or more embodiments of the present invention illustrating the metallic coating applied to the piezoelectric elements.

FIG. 9 illustrates another exemplary embodiment of a piezoelectric assembly which may be incorporated within the test probe assembly 10 of the present invention. The piezoelectric assembly 500 of FIG. 9 incorporates a cuboidal base substrate 502 identical to the base substrate 306 of the embodiment of FIGS. 7A-7D. In accordance with this process, the etching step is removed and a piezoelectric film, layer or element 504 is deposited directly on each of the four sides of the base substrate 502. The piezoelectric film 504 may include piezoelectric film or strip 504 which is thicker than the prior embodiments. A metal coating 506 is deposited on each side of the base substrate to at least partially enclose the piezoelectric element. In the alternative and with reference to FIG. 10, a piezoelectric assembly 600 includes a cylindrical base substrate 602 with a coaxial piezoelectric film, coating or element 604 is provided. A metallic base 606 may be placed at 90° intervals about the piezoelectric film 604.

Referring now to FIG. 11, a flow chart 700 of one exemplary methodology of use of the test assembly 10 of the present disclosure is illustrated. This methodology may be utilized with any of the piezoelectric assemblies 100, 200, 300, 400, 500, 600 discussed hereinabove. The test probe assembly 10 is mounted to a TEL prober and positioned relative to a semiconductor wafer to be tested. In the absence of a magnetic field, for example, when $B_{EXT}=0$ (STEP 702), there is no deflection in the probe ends 20 of the test probes 14. In the presence of a magnetic field $B_{EXT}\neq0$ (STEP 704), which may be applied to activate the components of the semiconductor wafer during a testing procedure, the piezoelectric elements are actuated causing at least the probe ends 20 of one or more of the test probes 14 to deflect. The deflection is likely multidirectional having x, y and z-components of deflection. The stress, strain and/or deflecting forces realized by the piezoelectric elements of the piezoelectric assembly results in the generation of a composite voltage $V_C$ (STEP 706) which is captured and stored by a capacitor as charge Q where Q=C $V_C$ (STEP 708) and where C is represented as the capacitance of the capacitor. The composite voltage $V_C$ is representative of, and/or proportional to, the direction and degree of deflection of the piezoelectric elements along the x, y and z-axes, and, corresponding deflection of the probe end 20. The data associated with the composite voltage $V_C$ is processed by a processor having associated logic, algorithms, etc. which is used to calculate the required movement needed to realign the probe end 20. More specifically, the processor calculates the $V_{APP}$ required to actuate the piezoelectric elements on the probe end 20 to realign the probe end 20 to its original opposition while also compensating for the $F_{EXT}$ or intensity of the external magnetic field to which the respective piezoelectric elements are subjected, for example, during actuation of some of the electrical components of the semiconductor wafer. (STEP 710). Once calculated, the $V_{APP}$ is applied to the piezoelectric assembly in a controlled manner to actuate one or more of the piezoelectric elements of the assembly to return the probe end 20 to its original position. (STEP 712). The required $V_{APP}$ is provided in part by release of the voltage stored in the capacitor in connection with STEP 708 and also from an external voltage source (not shown).

Figure 12:
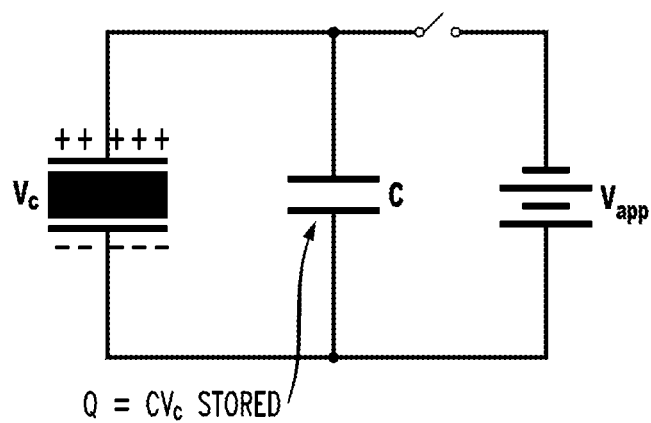
FIG. 12 is a circuit diagram illustrating the relationship of the voltage generated by the piezoelectric assembly, the capacitor and the applied voltage to return the probe end to an original position.

FIG. 12 is a basic circuit diagram illustrating the composite voltage $V_C$ generated by the piezoelectric assembly of each test probe 14, the charge Q stored in each capacitor "C" and the $V_{APP}$ required to realign the probe end 20 of the individual test probe 14. A portion of the voltage of the $V_{APP}$ is supplied by an external source.

Figure 13:
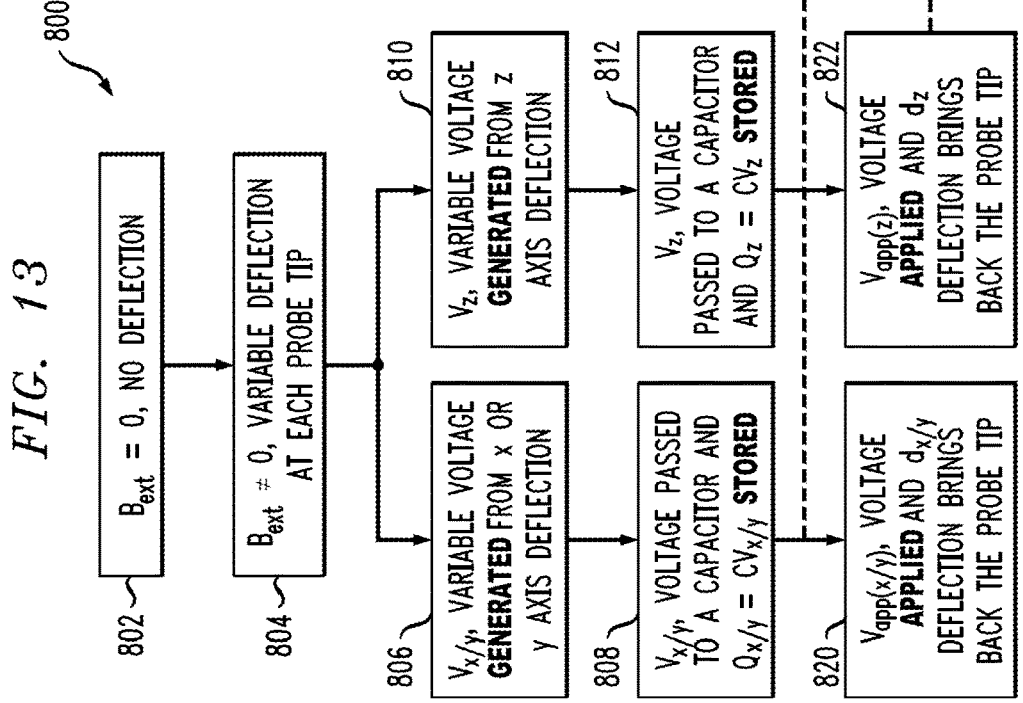
FIG. 13 is a flow chart illustrating another exemplary methodology of use of the test probe assembly for detecting deflection of probe ends of individual test probes according to one or more embodiments of the present application.

Referring now to FIG. 13, a second flow chart 800 in accordance with another exemplary embodiment methodology of use of the test assembly 10 of the present disclosure is illustrated. This methodology may be utilized with any of the piezoelectric assemblies 100, 200, 300, 400, 500, 600 discussed hereinabove. In the process represented by this chart 800, activation and movement of the piezoelectric elements and the probe ends 20 in the x and y directions is tracked separately from movement of the piezoelectric elements and the probe ends 20 in the z-direction. In Step 802, the probe end of the individual test probe 14 is in its original at rest position in the absence of a magnetic field $B_{EXT}=0$. Thereafter, the test probe 14 is subjected to a magnetic field $B_{EXT}\neq 0$ (STEP 804), which causes deflection of the probe ends 20 of individual probes 14 in multi-directions. Movement of the probe end 20 in the x and y directions causes the generation of an accompanying voltage $V_{X/Y}$ by the piezoelectric elements (STEP 806) which is captured and stored as a charge $Q_{X/Y}$ in a first capacitor (STEP 808). Movement of the respective probe end 20 along the z-axis causes the associated piezoelectric elements to generate an accompanying voltage $V_Z$ (STEP 810) which is captured and stored as charge $Q_Z$ in a second capacitor (STEP 812). The processor than calculates the voltages $V_{APP(X/Y)}$, $V_{APP(Z)}$ required to move the respective individual probe ends in the x and y directions and in the z-direction accounting for the respective magnetic field components $F_{EXTt(X/Y)}$, $F_{EXT(Z)}$ (STEPS 814 and STEP 816) to return the probe end 20 to its original aligned position. The voltage $V_{APP(X/Y)}$ is applied to the side piezoelectric elements of the piezoelectric assemblies to effect movement of the probe end along the x and y axes (STEP 820) and the voltage $V_{APP(Z)}$, is applied to the respective upper and lower piezoelectric elements to effect movement of the probe end 20 along the z axes (STEP 822) to cause the desired return of the individual probe end of the individual test probe to their respective original positions.

In other embodiments, bent probe ends 20 of one or more test probes 14 may be visually identified in connection with an inspection process. The degree and direction of deflection may be calculated and entered into a processor. Thereafter, a composite voltage is applied to one or more of the piezoelectric elements of the piezoelectric assembly associated with the test probe 14 to actuate the piezoelectric assembly and move the probe end 20 to its original position. It is appreciated that once returned to its original position, the probe end 20 is reoriented to assume its original position even upon removal of the composite voltage.

Figure 14:
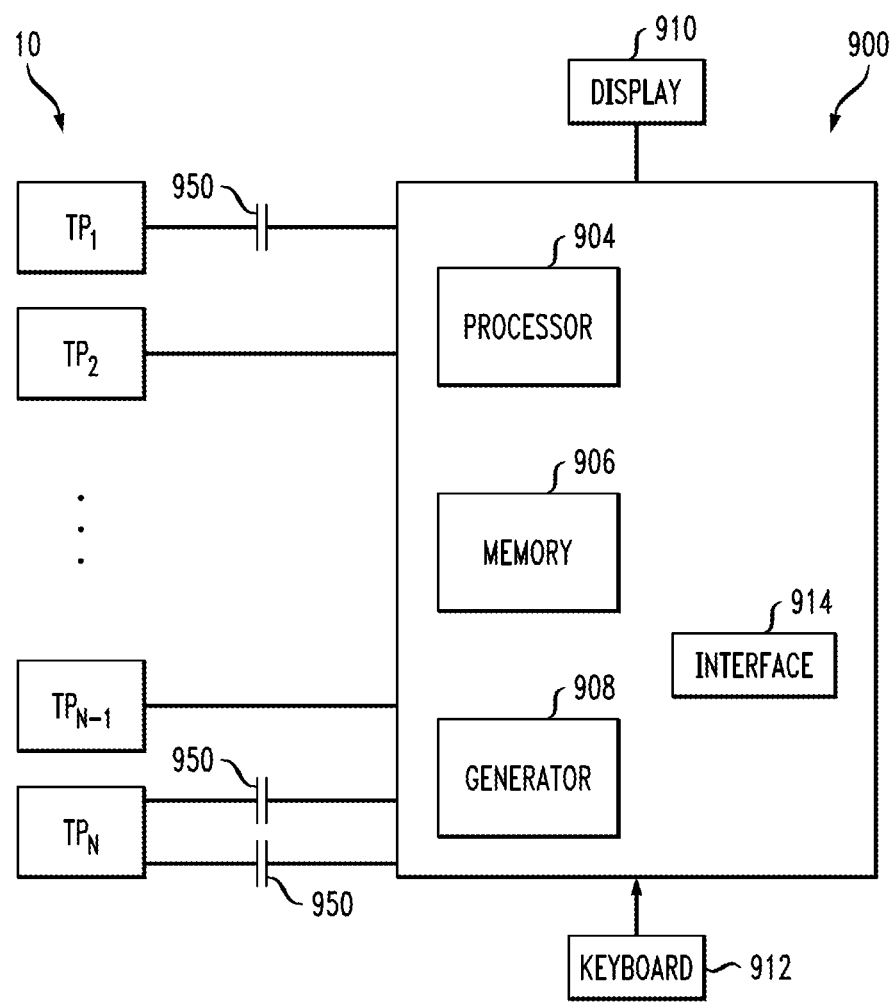
FIG. 14 is a schematic of a system including a processor, memory and the test probe assembly according to one or more embodiments of the present application.

FIG. 14 illustrates a system 900 adapted for 1) detecting displacement of probe ends 20 of individual test probes; and 2) for realigning the probe ends of the individual test probes 14 for use in a semiconductor wafer test procedure in accordance with the embodiments of the present invention. The system includes the test assembly 10 including multiple test probes 14 identified in FIG. 14 as $TP_1$-$TP_N$, with each test probe having one of the embodiments of the piezoelectric assemblies mounted thereto, a workstation 902 including a controller or processor 904 having memory 906 with software or logic programmed to perform the various functions associated with the afore-described detection and alignment processes, and a voltage generator 908 for delivery to the piezoelectric elements of the individual test probes. The system 900 includes a visual or graphical display 910, a keyboard and mouse 912 for receiving user input and an interface 914 (e.g., wireless or electrical/mechanical connection such as a USB port or a CD-ROM) to permit import of program instructions in accordance with embodiments of the present application. The piezoelectric elements of each individual piezoelectric assembly mounted to each individual test probe $TP_1$-$TP_N$ are coupled to the processor 904 such that voltage output caused by deformation of the individual piezoelectric elements can be processed by the various software programs, algorithms etc. of the processor 904 to calculate the $V_{APP}$ required to realign the probe ends 20 of the individual test probes 14 in the manner discussed hereinabove. Also depicted in the figure are the capacitors 950 which are coupled to each piezoelectric assembly of each individual test probe 13. Test probe $TP_N$ is shown coupled to two capacitors to individually track and realign movement along the x and y axes and the z axes as described in connection with the method of use in the flow chart of FIG. 13. The system 900 may be a stand-alone system or a subsystem or module couplable with a conventional testing system such as the TEL prober. The system may be coupled to a public network such as the Internet, or coupled to a private network, an "intra-net." The logic or software containing program instructions embodying methods in accordance with embodiments of the present application may be located on remote computers or within the system. In addition, the system may be coupled to the testing apparatus through a network connection.

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 15:
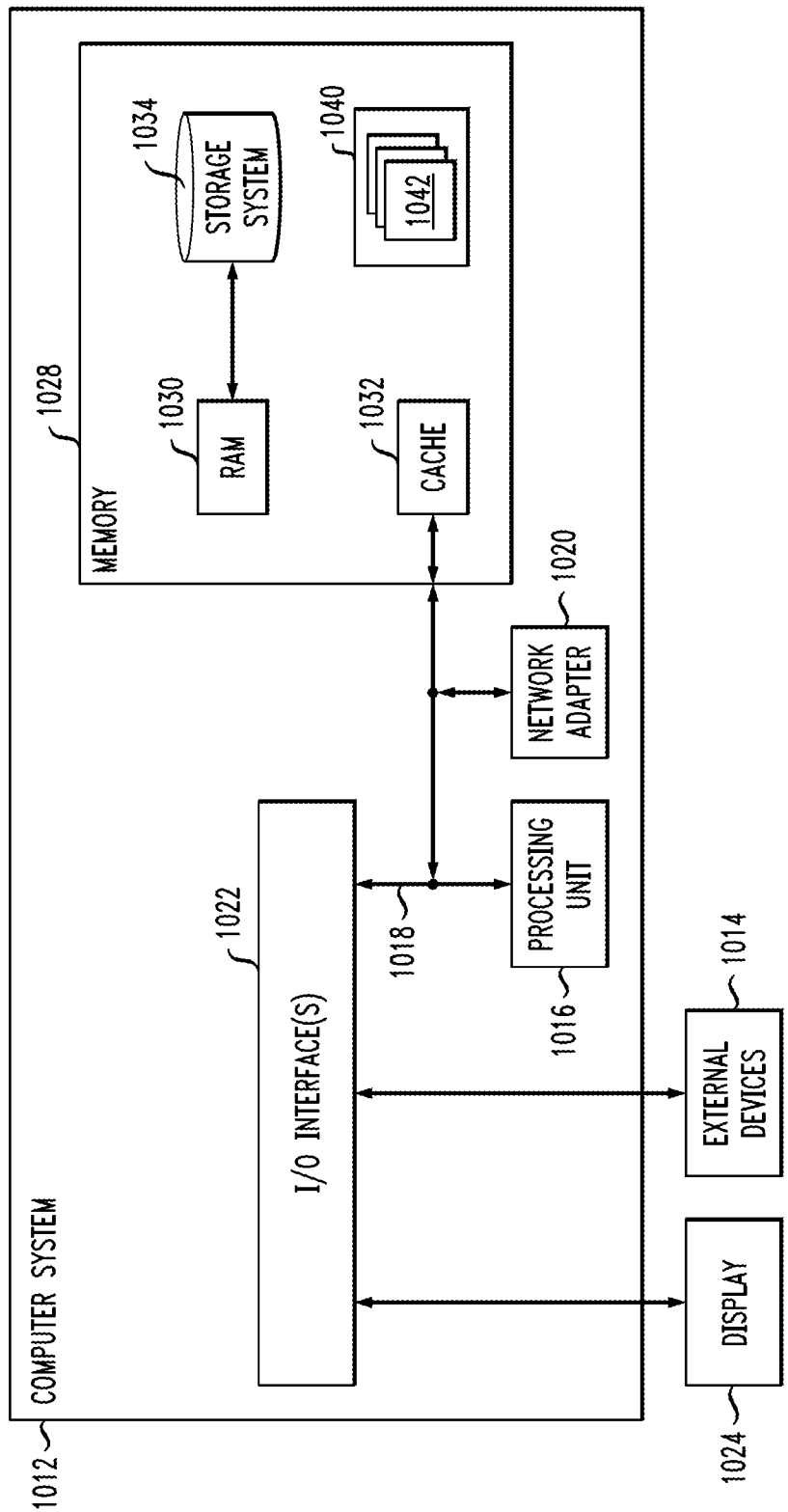
FIG. 15 depicts a computer system in accordance with which one or more components/steps or techniques of the invention may be implemented according to an exemplary embodiment of the invention.

One or more embodiments can make use of software running on a general-purpose computer or workstation. With reference to FIG. 15, in a computing node 1010 there is a computer system/server 1012, which is operational with numerous other general purposes or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 15, computer system/server 1012 in computing node 1010 is shown in the form of a general-purpose computing device. The components of computer system/server 1012 may include, but are not limited to, one or more processors or processing units 1016, a system memory 1028, and a bus 1018 that couples various system components including system memory 1028 to processor 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random-access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1018 by one or more data media interfaces. As depicted and described herein, the memory 1028 may include at least one program product having a set (e.g., at least one) of program modules that are configured to carry out the functions of embodiments of the invention. A program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the invention as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via I/O interfaces 1022. Still yet, computer system/server 1012 can communicate with one or more networks such as a LAN, a general WAN, and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 16:
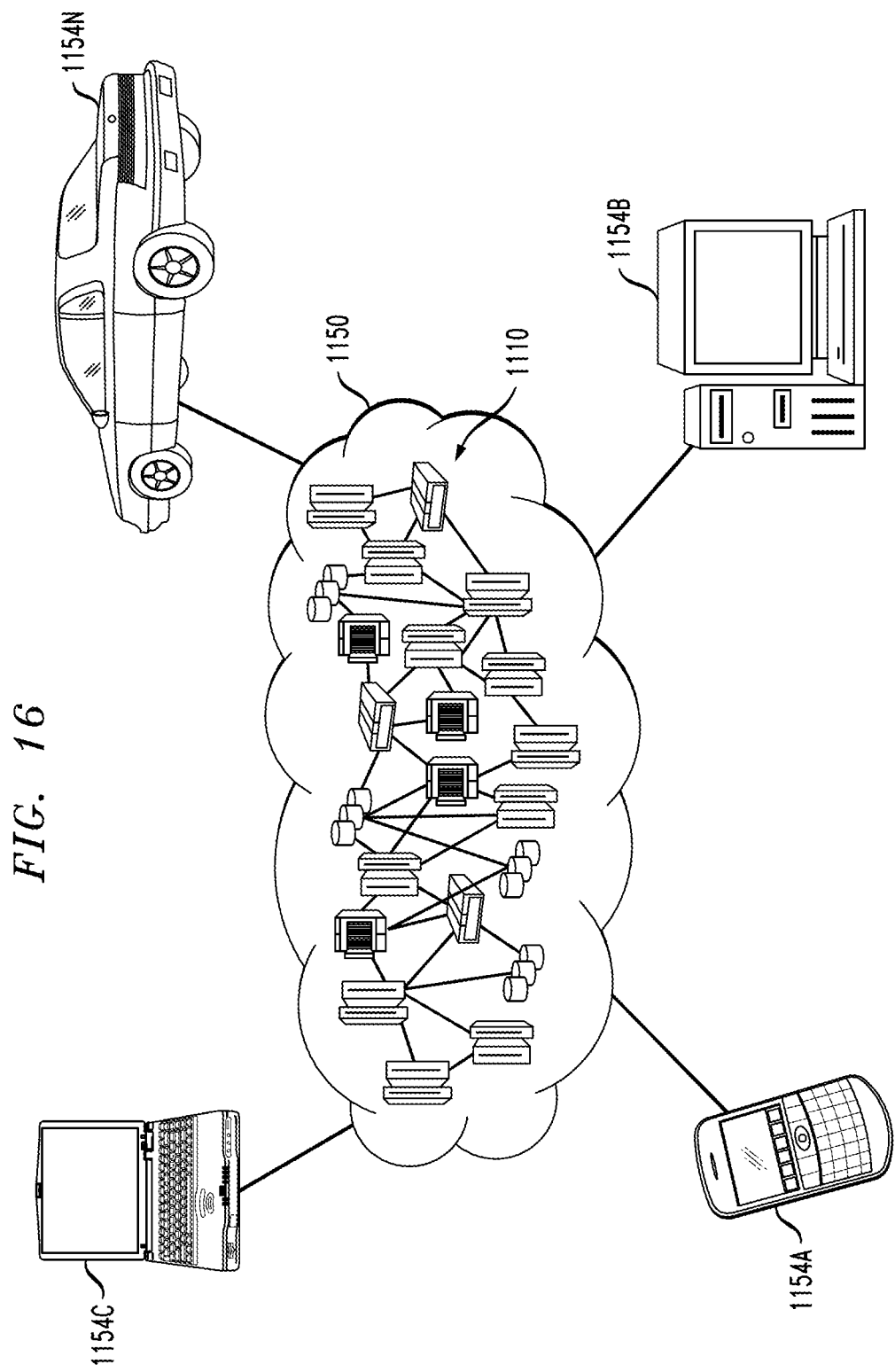
FIG. 16 depicts a cloud computing environment according to an exemplary embodiment of the present invention.

Referring now to FIG. 16, illustrative cloud computing environment 1150 is depicted. As shown, cloud computing environment 1150 includes one or more cloud computing nodes 1110 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1110 may communicate with one another. They may be grouped (not shown) physically or virtually, in one or more networks, such as Private, Community, Public, or Hybrid clouds as described hereinabove, or a combination thereof. This allows cloud computing environment 1150 to offer infrastructure, platforms and/or software as services for which a cloud consumer does not need to maintain resources on a local computing device. It is understood that the types of computing devices 1154A-N shown in FIG. 16 are intended to be illustrative only and that computing nodes 1110 and cloud computing environment 1150 can communicate with any type of computerized device over any type of network and/or network addressable connection (e.g., using a web browser).

Figure 17:
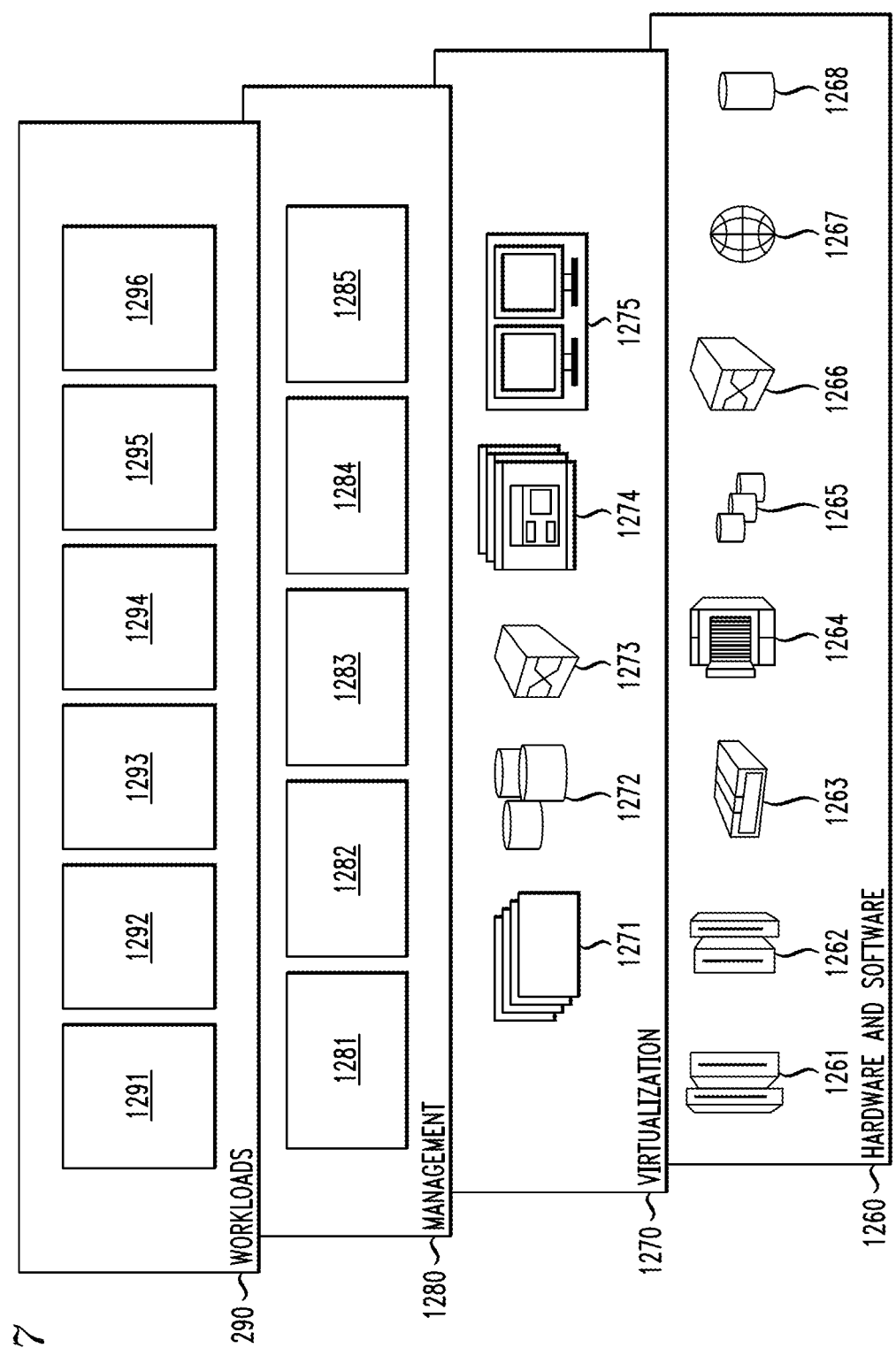
FIG. 17 depicts abstraction model layers according to an exemplary embodiment of the present invention.

Referring now to FIG. 17, a set of functional abstraction layers provided by cloud computing environment 1250 (FIG. 16) is shown. It should be understood in advance that the components, layers, and functions shown in FIG. 17 are intended to be illustrative only and embodiments of the invention are not limited thereto. As depicted, the following layers and corresponding functions are provided:

Hardware and software layer 1260 include hardware and software components. Examples of hardware components include: mainframes 1261; RISC (Reduced Instruction Set Computer) architecture-based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from the workload layer 1290 include data analytics processing 1291, test probe processing 1292 which may perform various functions described above with respect to manufacturing test probes with the piezoelectric elements 1293, detecting misaligned test probes 1294, realigning test probes 1295 and controlling circuitry 1296 using the methodologies and techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test probe assembly comprising:
   a probe card;
   a plurality of test probes mounted to the probe card, the test probes each having a probe end; and
   one or more piezoelectric elements mounted to each test probe, the one or more piezoelectric elements configured to individually move respective probe ends of the test probes in at least one direction to facilitate alignment of the probe ends in connection with a testing process on a semiconductor wafer.

2. The test probe assembly of claim 1 wherein the one or more piezoelectric elements are configured to move respective probe ends in at least an x-direction and a y-direction.

3. The test probe assembly of claim 2 wherein the one or more piezoelectric elements are further configured to move respective probe ends in a z-direction.

4. The test probe assembly of claim 3 wherein the one or more piezoelectric elements are configured to detect movement of the respective probe ends in at least one of the x-direction, the y-direction and the z-direction.

5. The test probe assembly of claim 4 wherein the one or more piezoelectric elements are configured to detect movement of the respective probe ends in each of the x-direction, the y-direction and the z-direction.

6. The test probe assembly of claim 3 including at least two piezoelectric elements mounted to each test probe.

7. The test probe assembly of claim 6 including four piezoelectric elements mounted to each test probe.

8. The test probe assembly of claim 7 wherein each test probe includes a piezoelectric assembly having a substrate defining a rectangular shape with four sides, each side having the piezoelectric element.

9. The test probe assembly of claim 7 wherein each test probe includes a piezoelectric assembly having a substrate defining a cylindrical configuration, the piezoelectric elements being equidistantly spaced about a perimeter of each test probe.

10. The test probe assembly of claim 1 wherein the one or more piezoelectric, elements are disposed adjacent the respective probe ends of the test probes.

11. A method, comprising:
mounting one or more piezoelectric elements to a test probe of a test probe assembly;
detecting, with the one or more piezoelectric elements, a degree of deflection of the probe end of the test probe from an original position; and
selectively actuating the one or more piezoelectric elements to return the probe end toward the original position;
wherein the step of selectively actuating is based in part on the detected degree of deflection of the probe end by the one or more piezoelectric elements; and
wherein the steps are performed by at least one processor device coupled to a memory.

12. The method of claim 11 wherein detecting includes detecting the degree of deflection of the probe end of the test probe in an x-direction, a y-direction and a z-direction and wherein selectively actuating includes moving the probe end of test probe in the x-direction, the y-direction and the z-direction toward the original position.

13. The method of claim 12 including mounting one or more piezoelectric elements adjacent the probe end of each test probe of the test probe assembly.

14. The method of claim 12 wherein moving selectively actuating includes applying a voltage to the one or more piezoelectric elements.

15. The method of claim 11 wherein:
detecting the degree of deflection of the probe end of the test probe includes determining an electric charge generated by the one or more piezoelectric elements in response to a strain or stress exerted on the one or more piezoelectric elements when the probe end is deflected from the original position to a deflected position; and
selectively actuating the one or more piezoelectric elements includes determining, based at least in part on the electric charge, an application electric charge required to return the probe end toward the original position.

16. A system comprising:
a test probe assembly, including:
a probe card;
a plurality of test probes mounted to the probe card, each test probe having a probe end;
one or more piezoelectric elements mounted to each test probe, the one or more piezoelectric elements configured to:
generate an output voltage upon individual displacement of the probe end of each test probe from an original position; and
return the probe end of each test probe toward the original position upon actuation of the one or more piezoelectric elements; and
a processor including logic configured to control actuation of the one or more piezoelectric elements of each test probe to cause return of the probe end of each test probe to the original position.

17. The system of claim 16 wherein the processor is configured to determine the displacement of the probe end of each test probe from the original position based on output voltage generated by the one or more piezoelectric elements.

18. The system of claim 17 wherein each test probe is coupled to a capacitor to collect the output voltage generated by the one or more piezoelectric elements.

19. The system of claim 16 wherein each test probe includes four piezoelectric elements configured to effect multidirectional movement of the probe end upon actuation thereof.

20. The system of claim 16 including an external voltage source coupled to the one or more piezoelectric elements of each probe.

* * * * *